United States Patent
Gardner et al.

[11] Patent Number: 6,027,992
[45] Date of Patent: Feb. 22, 2000

[54] SEMICONDUCTOR DEVICE HAVING A GALLIUM AND NITROGEN CONTAINING BARRIER LAYER AND METHOD OF MANUFACTURING THEREOF

[75] Inventors: Mark I. Gardner, Cedar Creek; Mark C. Gilmer, Austin, both of Tex.

[73] Assignee: Advanced Micro Devices, Sunnyvale, Calif.

[21] Appl. No.: 08/993,455

[22] Filed: Dec. 18, 1997

[51] Int. Cl.$^7$ ............................................. H01L 21/3205
[52] U.S. Cl. ...................................................... 438/588
[58] Field of Search ................................. 438/588, 591, 438/592, 593, 643; 257/73

[56] References Cited

U.S. PATENT DOCUMENTS

| | | |
|---|---|---|
| 4,985,742 | 1/1991 | Pankove . |
| 5,502,005 | 3/1996 | Mikagi . |
| 5,612,574 | 3/1997 | Summerfelt et al. . |
| 5,684,309 | 11/1997 | McIntosh et al. . |
| 5,726,087 | 3/1998 | Tseng et al. . |

FOREIGN PATENT DOCUMENTS 408062590A  3/1996  Japan .

OTHER PUBLICATIONS

M. Bhat et al., MOS Characteristics of Ultrathin NO–Grown Oxynitrides, IEEE, pp. 421–423, 1994.

*Primary Examiner*—Charles Bowers
*Assistant Examiner*—Scott J. Hawranek

[57] ABSTRACT

The present invention relates to a process of forming a semiconductor device including forming a gallium and nitrogen bearing layer and forming at least one gate electrode over the gallium and nitrogen bearing barrier layer. The invention also includes a semiconductor device formed according to this process. In another embodiment, the invention includes a semiconductor device including a substrate, a gallium and nitrogen containing barrier layer disposed over the substrate, and at least one gate electrode disposed over the gallium and nitrogen bearing barrier layer.

18 Claims, 2 Drawing Sheets

6,027,992

SEMICONDUCTOR DEVICE HAVING A GALLIUM AND NITROGEN CONTAINING BARRIER LAYER AND METHOD OF MANUFACTURING THEREOF

FIELD OF THE INVENTION

The present invention is directed generally to a semiconductor device and method of manufacture thereof, and more particularly to a semiconductor device having a gallium and nitrogen containing barrier layer and method of manufacture thereof.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate electrode and gate insulating layer. The gate insulating layer is typically formed by growing or depositing a thin oxide (referred to as a gate oxide) over the substrate. The gate electrode is typically formed by depositing, usually through chemical vapor deposition (CVD), a layer of polysilicon over the gate oxide, patterning the polysilicon using a mask and etching, typically through a dry etch process, the polysilicon to form gate electrodes. The gate electrodes may be doped by doping the polysilicon layer prior to gate electrode etch with an appropriate type dopant (e.g., arsenic or phosphorus for an n-type device and boron for a p-type device). Alternatively, the gate electrodes may be doped in conjunction with the formation of the source/drain regions.

One particular problem with polysilicon gate electrodes is the tendency for the gate dopant (e.g., arsenic or boron) to diffuse into the gate oxide layer and, in some cases, through the gate oxide layer and into the channel region beneath the gate electrode. Such diffusion of the gate dopant can have a deleterious impact on device performance. To inhibit such diffusion of gate dopants, nitrogen-bearing gate oxides are often formed, for example, by growing the gate oxide in a nitrogen bearing ambient. The nitrogen in the gate oxide does tend to inhibit the diffusion of the gate dopant. The nitrogen in gate oxide, however, presents other problems. For example, the nitrogen often tends to upwardly diffuse into lower regions of the gate electrode. This inhibits doping of the lower regions of the gate electrode with the gate dopant and forms after a depletion layer in the gate electrode, negatively impacting the performance of the device.

SUMMARY OF THE INVENTION

Generally, the present invention relates to a semiconductor device having a gallium containing barrier layer and a process for manufacturing such device. The gallium containing layer may, for example, be a gallium and nitrogen containing layer such as a gallium nitride layer. In accordance with one embodiment of the invention, a semiconductor device is formed by forming a gallium and nitrogen containing barrier layer over a substrate and forming at least one gate electrode over the gallium and nitrogen containing barrier layer. A gate insulating layer may, for example, be formed between the gallium and nitrogen containing barrier layer and the substrate. The gallium and nitrogen containing barrier layer can, for example, inhibit diffusion of a gate dopant into and/or through the gate insualting layer. The gallium and nitrogen containing barrier layer can, for example, also inhibit diffusion of nitrogen if any from the gate oxide into the gate electrode.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
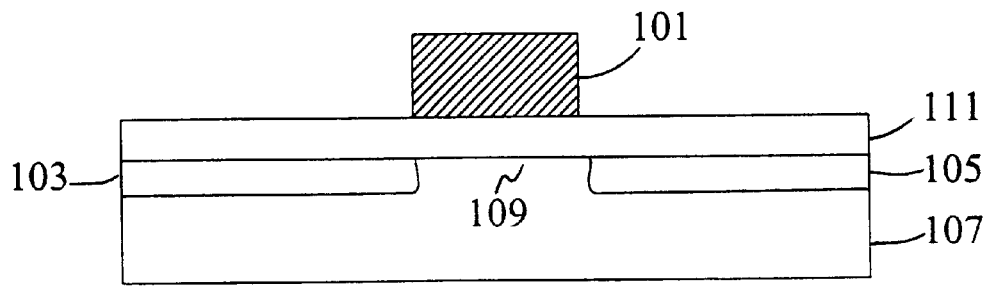
FIG. 1 illustrates a typical MOS device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which have a gate electrode and a gate insulating layer. The invention has been found to be particularly advantageous in MOS and CMOS devices. While the present invention is not so limited, an appreciation of various aspects of the invention is best gained through a discussion of various illustrative examples of processes used to form such semiconductor devices.

Figure 2A:
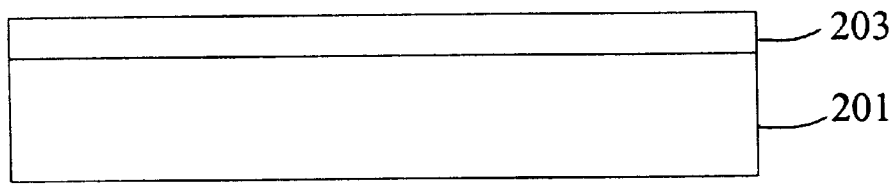
FIGS. 2A through 2E illustrate an exemplary process in accordance with one embodiment of the invention.

With reference to FIGS. 2A through 2E, one example process for fabricating a semiconductor device having a gallium and nitrogen containing barrier layer will be described. In FIG. 2A, a gate oxide layer 203 is formed over the silicon substrate 201. The gate oxide layer 203 may, for example, be a silicon dioxide, a nitrogen bearing oxide, or another suitable oxynitride or oxide, grown or deposited over the substrate 201 using well-known techniques. For example, an oxide may be grown over the substrate 201 by oxidizing the substrate 201 in an ambient of an oxygen or oxygen and nitrogen containing species, such as $O_2$, NO and/or $N_2O$. The thickness of the gate oxide layer may, for example, range from about 5 Å to about 60 Å and is about 5 to 15 Å in the example embodiment.

The presence of nitrogen in the gate oxide layer 203 generally improves the reliability and characteristics of the ultimately produced semiconductor device. For example, nitrogen in the gate oxide of a semiconductor MOS device serves to inhibit the dopant in the gate electrode (e.g., boron atoms in a PMOS device or arsenic or phosphorus atoms in an NMOS device) from diffusing through the gate oxide layer and into the channel region. The improved reliability and characteristics are typically more apparent in PMOS devices which typically use lighter dopants such as boron than in NMOS devices which typically use heavier dopants such as arsenic or phosphorus. For example, a PMOS device which employs a nitrogen-rich gate oxide may exhibit reduced off-state current as compared to an NMOS device formed over a similar gate oxide.

Figure 2B:
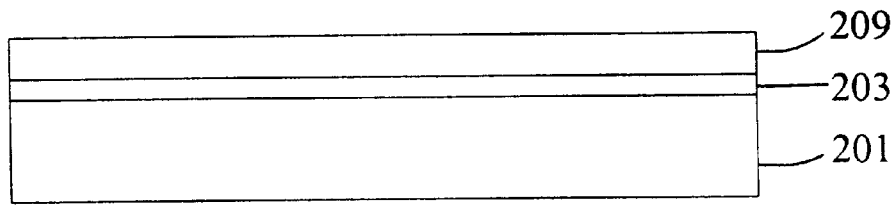

A barrier layer 209 of a gallium and nitrogen containing material, such as a gallium nitride, is formed over gate oxide layer 203 as illustrated in FIG. 2B. The gallium nitride barrier layer 209 can be deposited onto the gate oxide layer using a number of known techniques. Typically, gallium nitride is formed from tetromethyl-gallium (TMG) and $NH_3$ in a vacuum environment. For example, gallium nitride may be deposited using, for example, jet vapor deposition (JVD), plasma enhanced chemical vapor deposition (PECVD), or sputter deposition. The JVD, PECVD, and sputter processes are advantageously carried out at temperatures (e.g., room temperature) lower than required for process like chemical vapor deposition (CVD). Additional suitable processes include CVD and ultra-high vacuum chemical vapor deposition (UHV/CVD).

The gallium nitride barrier layer 209 will be used to inhibit diffusion of gate dopant from a gate electrode into and/or through the gate oxide layer 203 and will also serve to prevent diffusion of nitrogen, if any, in the gate oxide layer 203 from upwardly diffusing into gate electrode. The thickness of the gallium nitride barrier layer 219 is selected in consideration of the layer's ability to inhibit this gate dopant and/or nitrogen diffusion. Suitable thicknesses for a gallium nitride gate layer 219 range from about 5 to about 10 Angstroms for many applications.

Figure 2C:
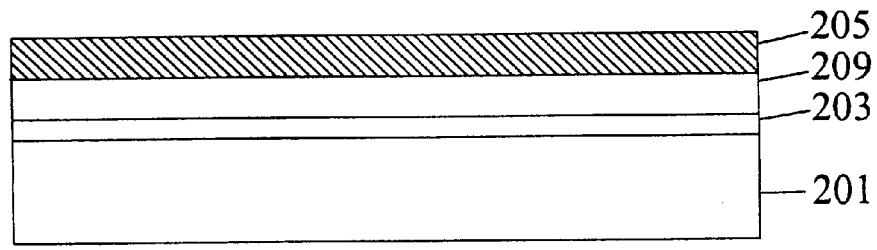

A gate electrode layer, such as a polysilicon layer 205, is formed over the gallium nitride barrier layer 209, as illustrated in FIG. 2C. The polysilicon layer 205 may have a depth ranging from 1000 to 2500 Å and may be formed using well-known techniques, such as chemical vapor deposition (CVD) of a polysilicon. The gallium nitride barrier layer 209 and the polysilicon layer 205 can be deposited in-situ using the same reaction tool, for example, by CVD. The polysilicon layer 205 will be used to form one or more gate electrodes over the substrate 201. The gate electrodes will be doped with a gate dopant, such as boron or arsenic, depending on the type of device formed (e.g., an n- or p-type device). The gate electrodes may be doped at this stage by doping the polysilicon layer, for example, by diffusion or implantation. Alternatively, as in the exemplary embodiment, the gate electrodes may be doped with the gate dopant during the formation of source/drain regions.

Figure 2D:
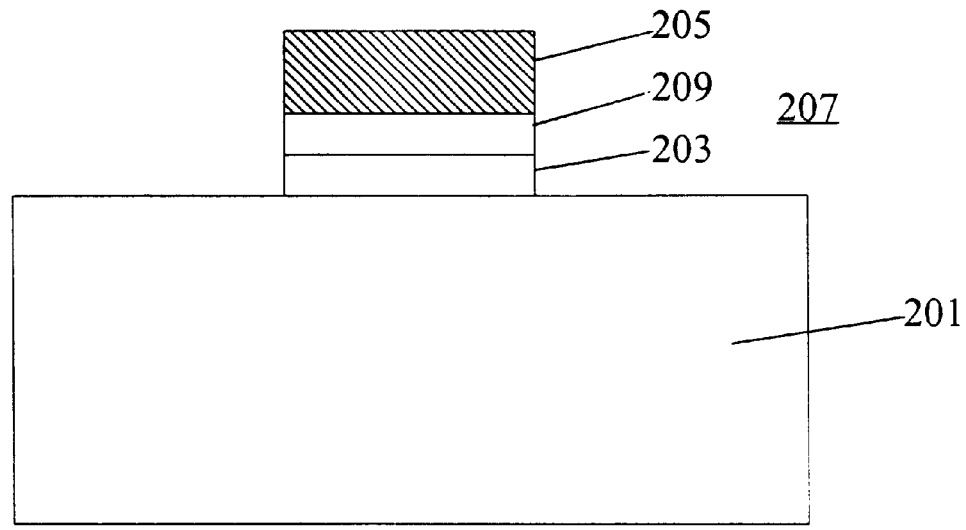

Portions of the polysilicon layer 205 are selectively removed to form gate electrodes (only one of which is shown), as illustrated in FIG. 2D. Removal of the gate polysilicon 205 may be performed using, for example, known etching techniques. Typically, the formation of the gate electrode 207 involves removal of the gate insulating layer 203 from active regions of the substrate 201 adjacent the gate electrode 207. Removal of the gate insulating layer 203 may, for example, be performed using known etching techniques. These processes will vary, as is known in the art, depending on the ultimately desired structure of the semiconductor device being formed.

Figure 2E:
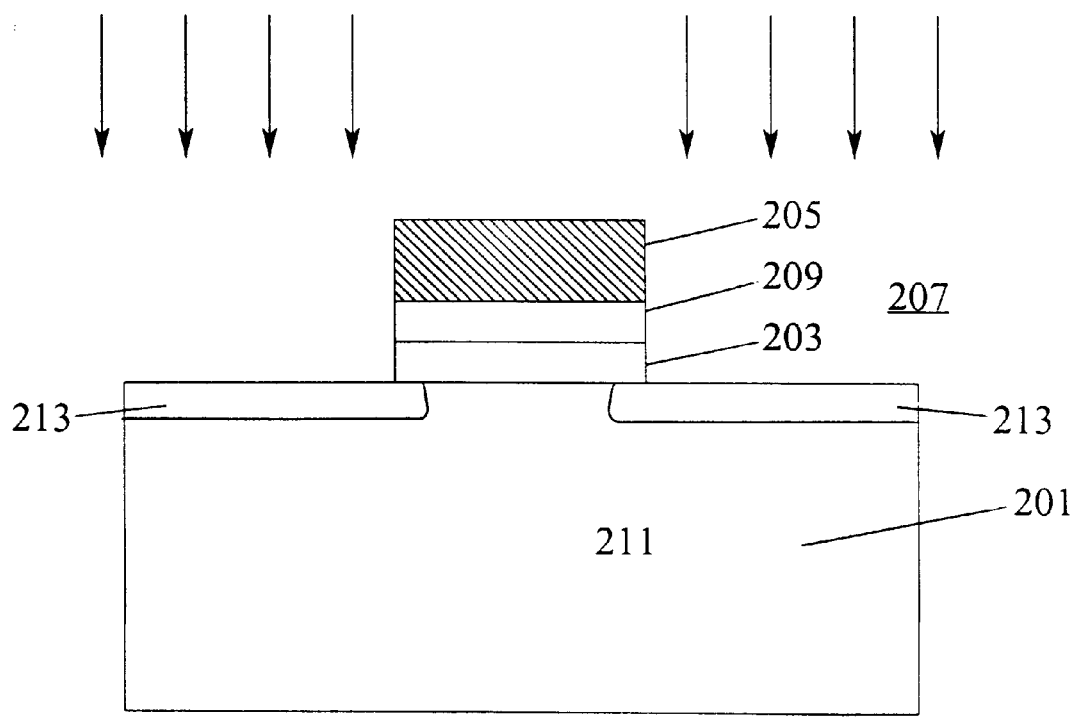

Source/drain regions 213 are formed in an active region of the substrate 201 adjacent the gate electrode 205, as illustrated in the FIG. 2E. The source/drain regions 213 may be formed in a number of different, known manners. Typically, formation of the source/drain regions 213 includes implanting one or more dopants into the substrate 201 and gate electrode 205 to form the source/drain regions 213 as well as to dope gate electrode 205. Following these implants, the structure is typically annealed to activate the dopants within the source/drain regions 213 and gate electrode 205. During the activation process, dopants, such those in the source/drain regions 213 as well as these in the gate electrode 205, as well as other impurities, such as any nitrogen in the gate oxide layer 203, will tend to diffuse. The gallium nitride barrier 209 will, however, serve to inhibit diffusion of the gate dopant into and/or through the gate oxide layer 203. Moreover, the gallium nitride barrier 209 will also typically serve to inhibit diffusion of any nitrogen in the gate oxide layer 203 from diffusing upward into the base of the polysilicon gate electrode 205. Fabrication of may continue with well-known processes, such as silicidation, contact formation, and so forth to form the ultimate device.

A gallium containing barrier layer 209, such as a layer of gallium nitride, generally improves the reliability and characteristics of the ultimately produced semiconductor device. For example, the gallium nitride barrier layer 209 in a semiconductor MOS device serves to inhibit the dopant in the gate electrode (e.g., boron atoms in a PMOS device or arsenic or phosphorus atoms in an NMOS device) from diffusing into and through the gate oxide layer into the channel region 211. Gallium nitride is advantageous for providing both gallium and nitrogen, each of which are effective for blocking diffusion of dopant and for protecting the thin gate oxide layer 203. Gallium nitride is particularly effective in providing a barrier to boron diffusion. The gallium nitride barrier layer also protects the gate electrode 205 by inhibiting diffusion of nitrogen from the gate oxide layer (and other lower layers such as the substrate 201) into the gate electrode 205.

The present invention is applicable to fabrication of a number of different devices where a gallium nitride diffusion barrier is desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process of forming a semiconductor device, comprising:

forming a gallium and nitrogen bearing barrier layer over a substrate;

forming a thin gate nitrogen-bearing oxide layer between the gallium and nitrogen bearing barrier layer and the substrate; and forming at least one doped-polysilicon gate electrode over the gallium and nitrogen bearing barrier layer.

2. The process of claim 1, wherein forming the nitrogen bearing oxide layer includes annealing the substrate in a nitrogen bearing ambient prior to forming the gallium nitride barrier layer.

3. The process of claim 2, wherein forming the nitrogen bearing oxide layer further includes implanting a nitrogen bearing species into the substrate prior to annealing the substrate in the nitrogen bearing ambient.

4. The process of claim 1, wherein the nitrogen bearing oxide layer is a deposited nitride.

5. The process of claim 1, wherein the gallium and nitrogen bearing barrier layer is formed by deposition.

6. The process of claim 1, wherein forming the gate electrode includes depositing and etching a layer of polysilicon.

7. The process of claim 6, wherein the polysilicon deposition is performed in-situ with the formation of the gallium and nitrogen bearing barrier layer.

8. The process of claim 1, wherein the gallium and nitrogen bearing diffusion barrier has a thickness ranging from about 5 to about 10 angstroms.

9. The process of claim 1, wherein the forming at least one gate electrode over the gallium and nitrogen barrier layer includes:

forming a polysilicon layer over the gallium and nitrogen bearing barrier layer; and removing portions of the polysilicon layer to form the at least one gate electrode.

10. The process of claim 9, further comprising doping the polysilicon layer before the removing step.

11. The process of claim 9, further comprising doping the polysilicon layer after the removing step.

12. The process of claim 1, wherein the forming at least one gate electrode includes doping at least a portion of a gate electrode layer with a p-type dopant.

13. The process of claim 12, wherein the dopant is boron.

14. The process of claim 1, wherein the forming at least one gate electrode includes doping at least a portion of a gate electrode layer with an n-type dopant.

15. The process of claim 14, wherein the dopant is arsenic or phosphorus.

16. A process of forming a semiconductor device, comprising:

forming a gallium and nitrogen bearing barrier layer over a substrate;

forming a thin gate nitrogen-bearing oxide layer between the gallium and nitrogen bearing barrier layer and the substrate; and forming at least one doped-polysilicon gate electrode over the gallium and nitrogen bearing barrier layer, including depositing polysilicon in-situ with the formation of the gallium and the nitrogen bearing barrier layer.

17. A process of forming a semiconductor device, according to claim 16, further including using one tool for the deposition of the polysilicon in-situ with the formation of the gallium and the nitrogen bearing barrier layer.

18. A process of forming a semiconductor device, according to claim 16, wherein the one tool is a CMP tool.

* * * * *